United States Patent
Yamamoto et al.

(10) Patent No.: US 7,408,412 B2
(45) Date of Patent: Aug. 5, 2008

(54) POWER AMPLIFIER AND WIRELESS COMMUNICATION DEVICE

(75) Inventors: Kazuya Yamamoto, Tokyo (JP); Tomoyuki Asada, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 107 days.

(21) Appl. No.: 11/470,642

(22) Filed: Sep. 7, 2006

(65) Prior Publication Data
US 2007/0057729 A1 Mar. 15, 2007

(30) Foreign Application Priority Data
Sep. 12, 2005 (JP) .............................. 2005-264168

(51) Int. Cl.
*H03G 3/30* (2006.01)
(52) U.S. Cl. ........................................ 330/285; 330/310
(58) Field of Classification Search .................. 330/133, 330/285, 310, 288, 296, 302
See application file for complete search history.

(56) References Cited

U.S. PATENT DOCUMENTS

| | | | |
|---|---|---|---|
| 6,690,237 B2 | 2/2004 | Miyazawa | |
| 6,946,913 B2 | 9/2005 | Moriwaki et al. | |
| 6,990,323 B2 * | 1/2006 | Prikhodko et al. | 330/285 |
| 7,145,397 B2 * | 12/2006 | Yamamoto et al. | 330/298 |
| 7,333,564 B2 * | 2/2008 | Sugiyama et al. | 330/127 |

FOREIGN PATENT DOCUMENTS

| | | |
|---|---|---|
| JP | 7-22857 | 1/1995 |
| JP | 11-220338 | 8/1999 |
| JP | 2001-257540 | 9/2001 |
| JP | 2002-43855 | 2/2002 |
| JP | 2004-72250 | 3/2004 |
| JP | 2004-343244 | 12/2004 |

* cited by examiner

*Primary Examiner*—Khanh V Nguyen
(74) *Attorney, Agent, or Firm*—Leydig, Voit & Mayer, Ltd.

(57) ABSTRACT

There are provided a power amplifying transistor, a bias circuit which supplies a bias current to the base of the power amplifying transistor, a current mirror circuit which detects a peak value of the collector voltage of the power amplifying transistor, and a control circuit which, when the peak value of the collector voltage becomes higher than a voltage set in advance, controls the bias circuit to increase the bias current.

7 Claims, 14 Drawing Sheets

FIG. 17

| | load curve | gain Gp | average Ic2 | peak Vc2 | Vb2 | Icb2 | Ic2/Icb2 | ACLR |
|---|---|---|---|---|---|---|---|---|
| point A | middle | middle (about 26dB) | middle (about 360mA) | middle | middle (about 1.015V) | low (about 4.8mA) | 360/4.8=75 | −42dBc |
| point B | steep gradient | low (about 22dB) | high (about 600mA) | low | low (about 0.85V) | high (about 7.5mA) | 600/7.5=80 | −28dBc |
| point C | gentle gradient | high (about 30dB) | low (about 200mA) | high | high (about 1.1V) | a little high (about 5.5mA) | 200/5.5=36 | −26dBc |

POWER AMPLIFIER AND WIRELESS COMMUNICATION DEVICE

BACKGROUND OF THE INVENTION

1. Field of the Invention

The present invention relates to a power amplifier and a wireless communication device capable of limiting a degradation in a distortion characteristic which occurs with a change in load.

2. Background Art

GaAs power amplifiers are presently used widely as a power amplifier for portable telephones including those used in CDMA systems. FIG. 10 is a block diagram showing a wireless communication device for a portable telephone for use in a CDMA system.

In FIG. 10, ANT denotes an antenna terminal through which a signal is transmitted and received. BB denotes a baseband signal processing section which demodulates and decodes a received signal, and which encodes and modulates a signal to be transmitted. RF-IC denotes an RF circuit which performs predetermined frequency conversion on the signal output from the section BB. BPF denotes a bandpass filter. PA denotes a power amplifier which amplifies a signal output from the section RF-IC. ISO denotes an isolator which is a unidirectional power transmitting device for eliminating the influence of variation in load at the antenna terminal ANT on the power amplifier PA. DUP denotes a duplexer which is a bandpass filter through which a signal to be transmitted is supplied from the power amplifier PA to the antenna terminal ANT, and through which a received signal from the antenna terminal ANT (in a band different from that for the transmission signal) is supplied to the receiving section RF-IC.

FIG. 11 is a circuit diagram showing a conventional power amplifier. Circuit elements surrounded by the broken line in FIG. 11 are formed on a GaAs chip. Other circuit elements are formed as chip components and lines on a module circuit board.

IN denotes an input terminal through which an RF signal is input. OUT denotes an output terminal through which an RF signal is output. Transistors $Tr_1$ and $Tr_2$ are heterojunction bipolar transistors (hereinafter referred to as "HBT") for amplifying power. Transistors $Tr_1$ and $Tr_2$ are provided in an initial stage and in a final stage, respectively. Bias1 and Bias2 denote bias circuits for supplying bias currents to the bases of the initial-stage and final-stage transistors Tr1 and Tr2. Vcb denotes a terminal through which power is supplied to the bias circuits Bias1 and Bias2. Vref denotes a terminal through which a voltage is input to the bias circuits Bias1 and Bias2.

Rb1, Rb2, Rb12 and Rb 22 denote resistors, C1 to C4, C21 to C23, Cd1, Cd2 and Cdb, capacitors; L1 and L2 inductors, L11 and L21 to L23, lines having particular electrical lengths and functioning as inductors, and Vc2 and Vb2, collector and base voltages on the transistor Tr2.

FIG. 12 is a circuit diagram showing the bias circuits Bias1 and Bias2. Trb1 to Trb5 denote HBTs, and Rbb1 to Rbb5 resistors. Vrefb denotes an input voltage terminal for the bias circuits Bias1 and Bias2, and Vcb a terminal for power supply terminal to the collectors of the bias circuits Bias1 and Bias2. Vbo1 and Vbo2 denote output terminals of the bias circuits Bias1 and Bias2. The bias circuits Bias1 and Bias2 operate so that idling current through the power amplifying transistors Tr1 and Tr2 (bias currents when no RF signal is input) are constantly maintained with respect to temperature (see, for example, Japanese Patent Laid-Open No. 2004-343244).

A distortion characteristic of a power amplifier largely influences variation in load at an antenna. In CDMA power amplifiers or the like in which particular importance is attached to a distortion characteristic among output characteristics, therefore, an isolator ISO is provided immediately after the power amplifier PA as shown in FIG. 10 to prevent the power amplifier PA from being influenced by variation in load at the antenna ANT. However, the isolator is comparatively high-priced among portable telephone components and substantially large in height. There is, therefore, a strong demand for a power amplifier designed to be reduced in price and size while ensuring the desired distortion characteristic without using the isolator. The adjacent channel leakage power ratio (ACLR) will be considered as an index of the distortion characteristic in the following description.

FIG. 13 shows a circuit for a load variation test on a conventional power amplifier without any isolator. In this circuit, a tuner for changing the impedance of the load on the circuit shown in FIG. 11 is provided on the circuit shown in FIG. 11. When the impedance ZL of the tuner is changed, the output load is changed.

FIG. 14 is a diagram showing characteristics of the power amplifier shown in FIG. 13 with respect to the phase of the tuner (output load). The ACLR, the power gain, collector current Ic2 in Tr2, collector voltage Vc2 and base voltage Vb2 of Tr2 and bias current Icb2 in Tr2 when forward wave output power as monitored through a coupler was constantly maintained were measured. The input power changes with respect to the phase by following the change in gain.

Curves $C_A$, $C_B$, and $C_C$ in FIG. 15 are examples of load curves with respect to an intermediate point A, a high-current point B, and a low-current point C in the collector current (operating current) Ic2 shown in FIG. 14. The actual load curves are expanded as shown in FIG. 16 due to a large reactance component. However, a description is made here by using FIG. 14 for simplification of interpretation.

At the high-current point B, the load curve has a steep gradient as indicated by $C_B$ in FIG. 15, and the increase in collector current Ic2 is large. At the low-current point C, the load curve has a gentle gradient as indicated by $C_C$ in FIG. 15, and the increase in collector current Ic2 at an idling point A1, which is a bias point when no RF input power is supplied, is small. Conversely, the gain is low at the point B but high at the point C.

The distortion characteristic (ACLR) of the power amplifier is determined by distortion balance between the initial-stage and final-stage transistors. Therefore, when the collector current Ic2 is low as at the point C, a degradation in ACLR recognized by comparison when the output power is fixed is large and there is a possibility of failure to meet the requirement of ACLR. These characteristics are summarized in FIG. 17.

Power amplifiers in which the bias for a final transistor is changed by detecting input power and output power have also been proposed (see, for example, Japanese Patent Laid-Open Nos. 2001-257540, 7-22857, 2004-72250, 2002-43855, and 11-220338).

In a CDMA power amplifier, however, output power is adjusted while controlling input power and the input and output powers change at all times according to the distance between the terminal using the amplifier and a base station. Therefore, a low-operating-current condition also exists in low-output operation and it cannot be discriminated form the low-operating-current condition at the point C. In the case of a low output, the power supply voltage is reduced by using a DC-DC converter to reduce the consumption of power. In such a case, the power gain is also reduced and it is difficult in practice to detect a change in load by detecting the power gain. Further, the voltage value of Vb2 increases when the output is low, and the low-output condition cannot be discriminated from the condition at the point C through detection of Vb2. For this reason, a change in load cannot be detected by detecting the input power and output power in the conventional art. Thus, there is a problem with the conventional power amplifier in that the distortion characteristic degrades when the load changes.

SUMMARY OF THE INVENTION

In view of the above-described problem, an object of the present invention is to provide a power amplifier and a wireless communication device capable of limiting a degradation in a distortion characteristic which occurs with a change in load.

In pursuit of the above-described object, the inventor of the present invention found that detection of a peak Vc2 value or Ic2/Icb2 suffices for detection of a degradation in ACLR. Icb2 corresponds to the base current in Tr2. Accordingly, Ic2/Icb2 corresponds to the current amplification factor of Tr2.

According to one aspect of the present invention, a power amplifier includes a power amplifying transistor; a bias circuit which supplies a bias current to the base of the power amplifying transistor; a current mirror circuit which detects a peak value of the collector voltage of the power amplifying transistor; and a control circuit which, when the peak value of the collector voltage becomes higher than a voltage set in advance, controls the bias circuit to increase the bias current.

The present invention makes it possible to limit a degradation in a distortion characteristic which occurs with a change in load.

Other and further objects, features and advantages of the invention will appear more fully from the following description.

BRIEF DESCRIPTION OF THE DRAWINGS

FIG. 17 is a diagram showing characteristics of a power amplifier.

DETAILED DESCRIPTION OF THE PREFERRED EMBODIMENTS

First Embodiment

Figure 1:
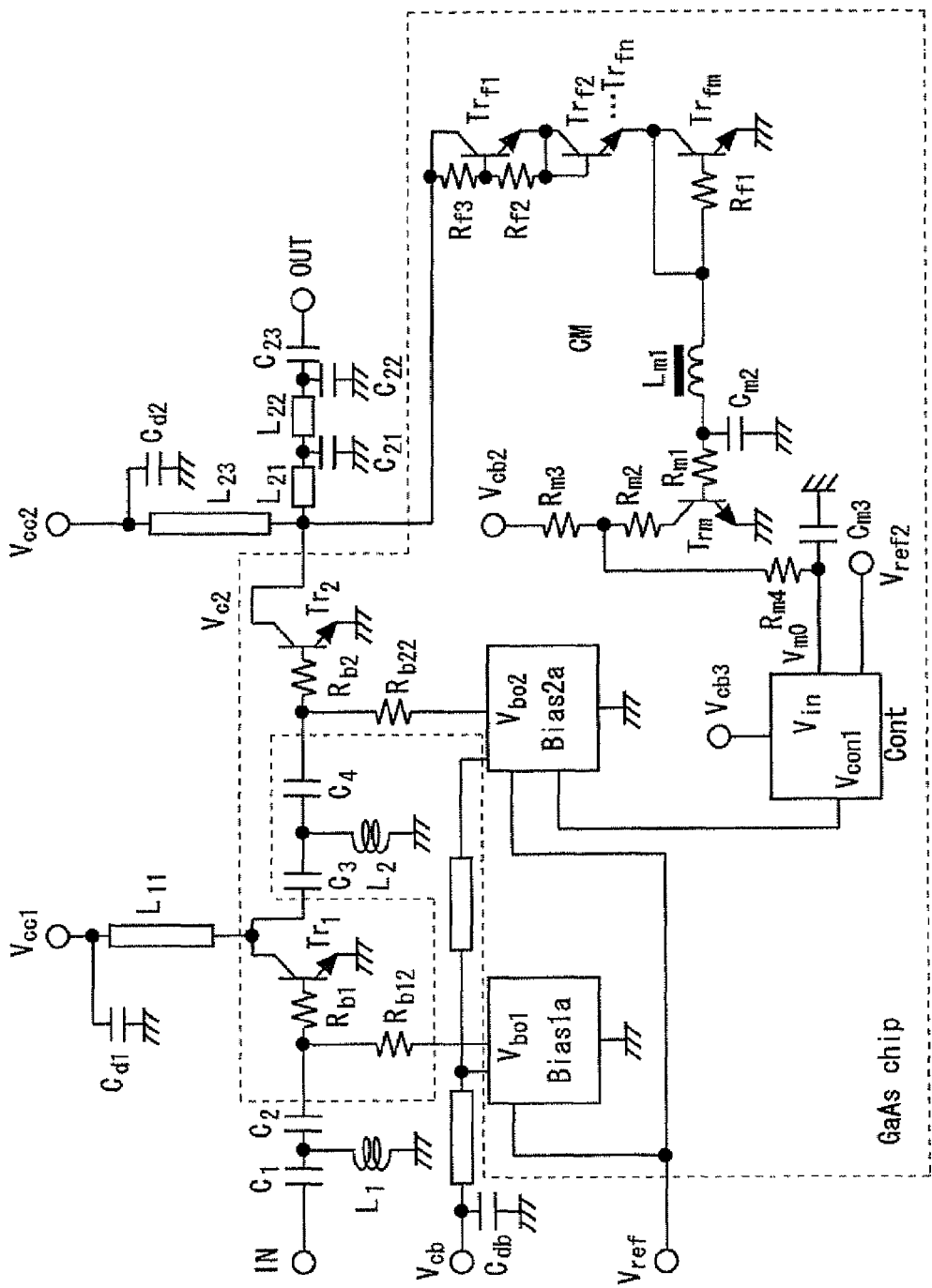
FIG. 1 is a circuit diagram showing a power amplifier according to a first embodiment of the present invention.
Figure 11:
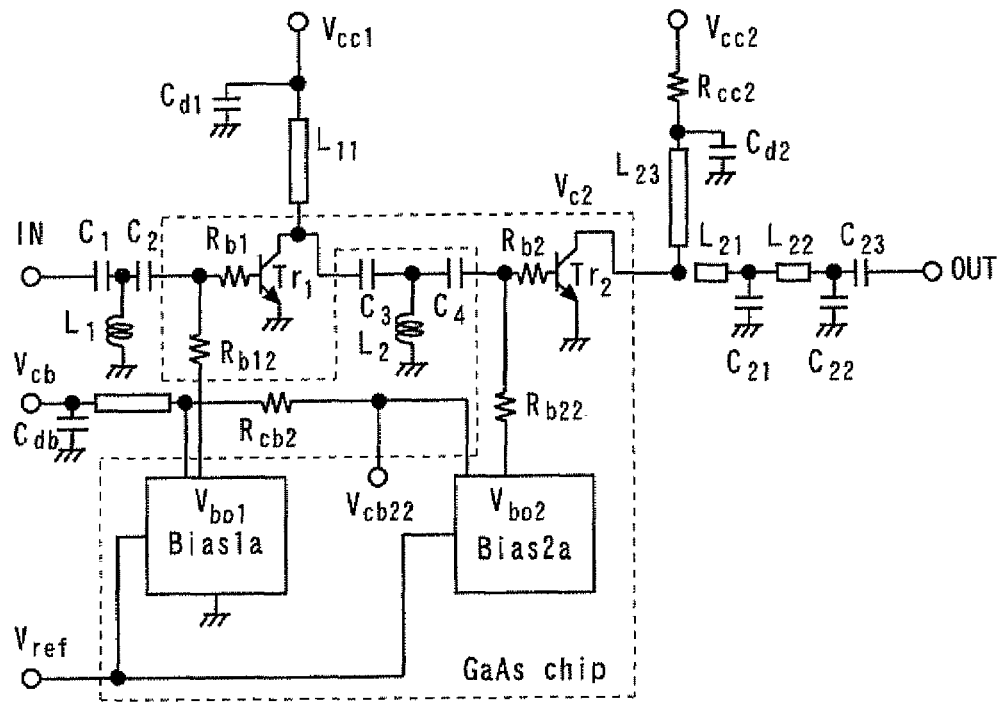
FIG. 11 is a circuit diagram showing a conventional power amplifier.

FIG. 1 is a circuit diagram showing a power amplifier according to a first embodiment of the present invention. This power amplifier has, in addition to the components of the conventional power amplifier shown in FIG. 11, a current mirror circuit CM which detects a peak value of the collector voltage of Tr2 (peak Vc2) and a control circuit cont which increase the bias current by controlling Bias2$a$ when the peak Vc2 becomes higher than a voltage value set in advance.

The current mirror circuit CM has transistors Trf1 to Trfn and Trfm, which are HBTs, resistors Rf1 to Rf3 and Rm1 to Rm4, capacitors Cm2 and Cm3, and a choke inductor Lm1. Lm1, Cm2 and Cm3 are smoothing elements for removing high-frequency components. These elements are too large to be formed on a GaAs and are, therefore, disposed as chip components on a module circuit board or the like.

Figure 2:
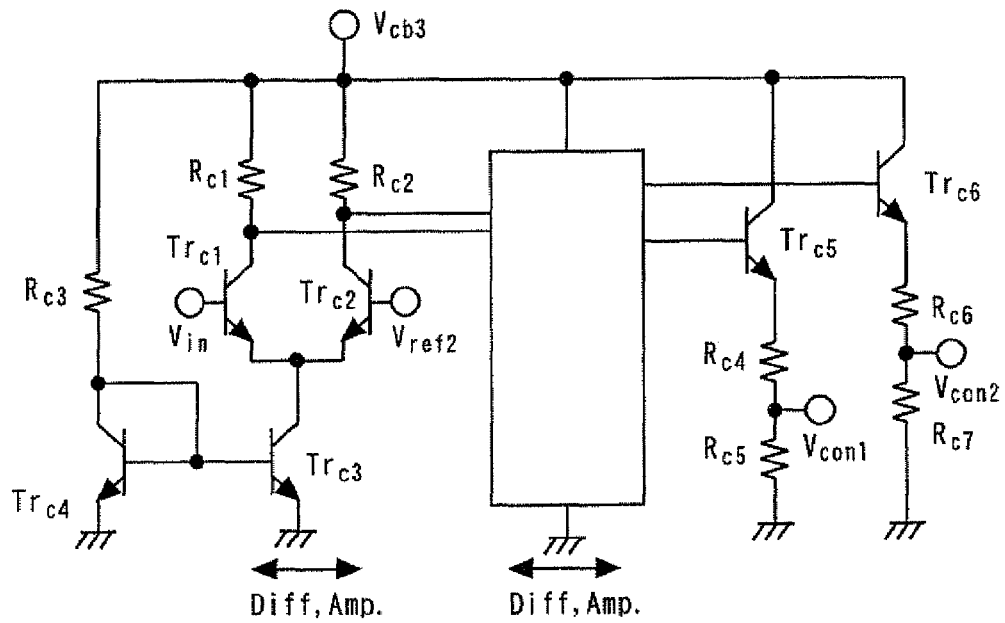
FIG. 2 is a circuit diagram showing the control circuit.3

FIG. 2 is a circuit diagram showing the control circuit. The control circuit is constituted by a differential amplifier and a level shift circuit and has transistors Trc to Trc6, which are HBTs, and resistors Rc1 to Rc7. Vin denotes an input voltage, and Vref2 a reference voltage. Vcon1 and Vcon2 denote output voltages. Vcb3 denotes a collector power supply.

Figure 3:
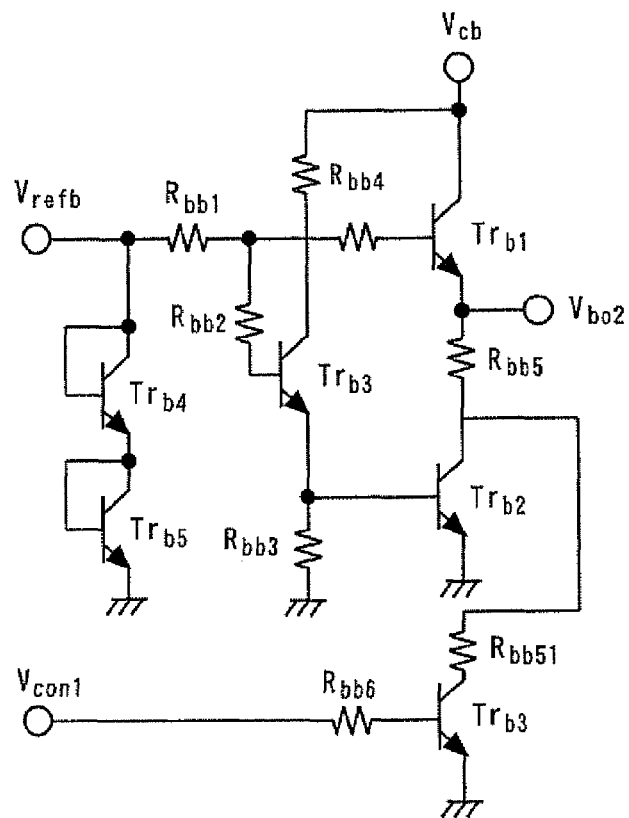
FIG. 3 is a circuit diagram showing the bias circuit for the rear-stage transistor.
Figure 12:
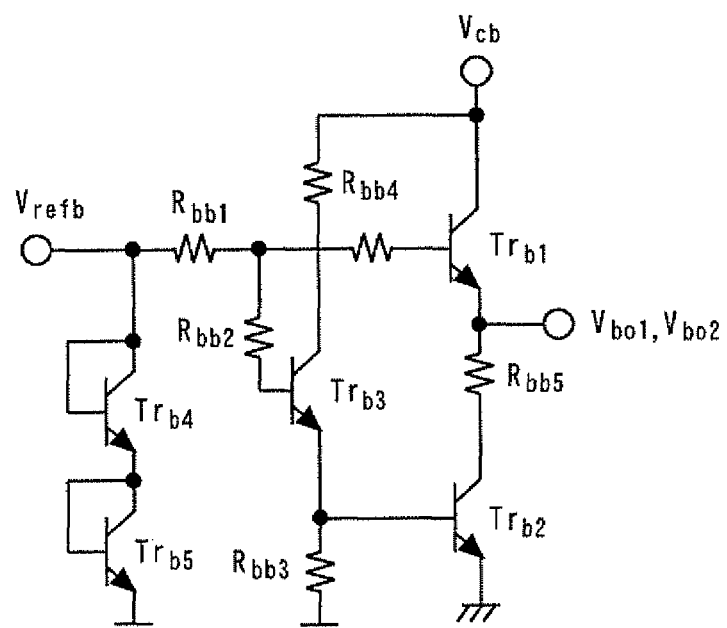
FIG. 12 is a circuit diagram showing the bias circuit.
Figure 13:
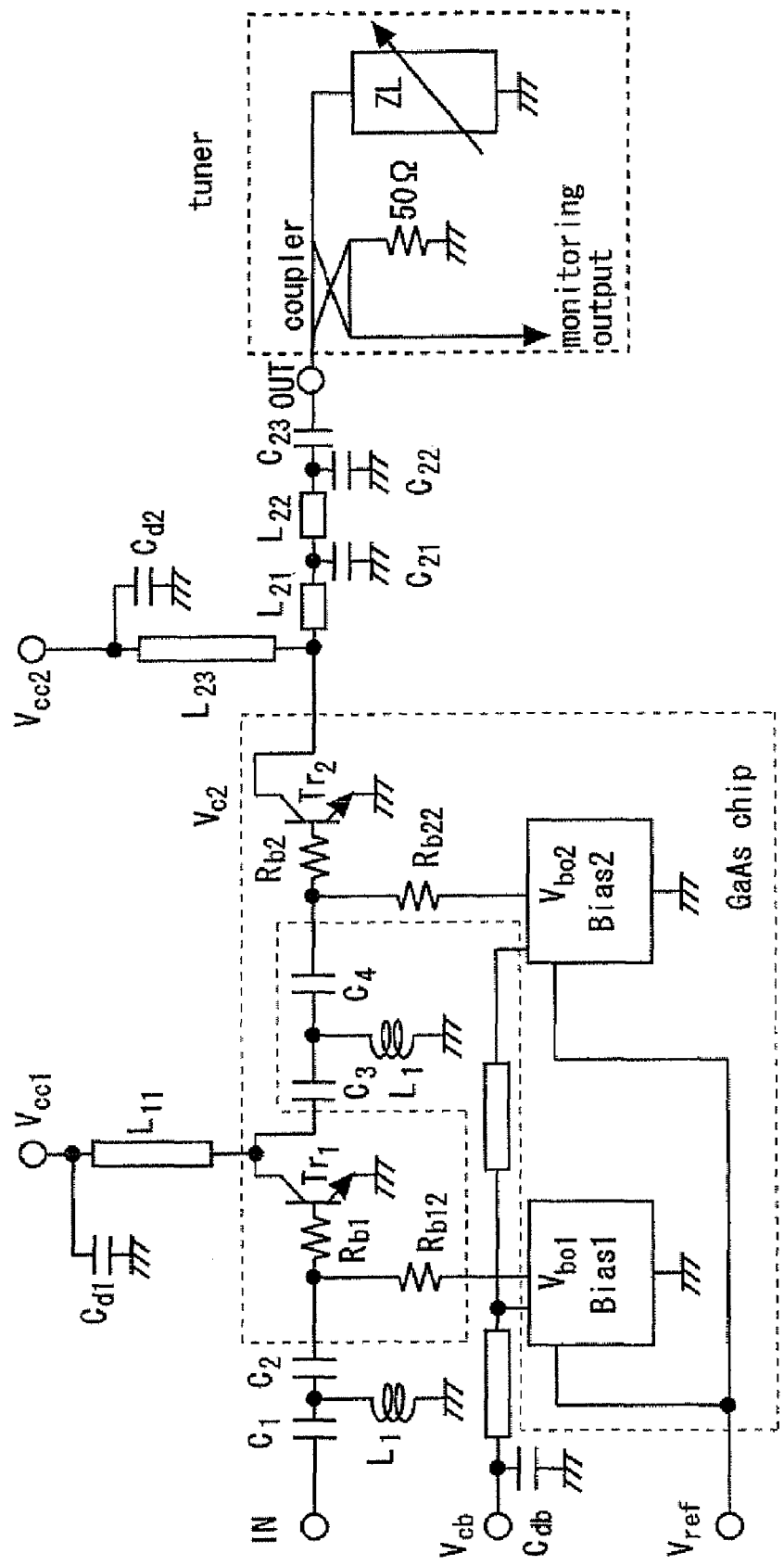
FIG. 13 shows a circuit for a load variation test on a conventional power amplifier without any isolator.

FIG. 3 is a circuit diagram showing the bias circuit for the rear-stage transistor. The rear-stage transistor bias circuit has, in addition to the components of the bias circuit shown in FIG. 12, a Trb3, which is an NBT, and resistors Rbb51 and Rbb6.

The operation of the above-described power amplifier will be described. When the collector voltage Vc2 of Tr2 exceeds the voltage set in the current mirror circuit CM with a Vbe multiplier for voltage monitoring, a current flows through Trfm and a current also flows through Trm. A monitored voltage Vmo is thereby reduced relative to a reference voltage Vref2; Vcon1 changes from high to low; the state of Trb3 is changed from the on state of the off state; and the bias current in Tr2 increases, thus improving the distortion characteristic. This circuit can be formed only by the power amplifier and does not require any additional circuit other than the power amplifier. Since the necessary circuit can be implemented on a GaAs chip, there is no need for cooperation with any peripheral circuit.

Second Embodiment

Figure 4:
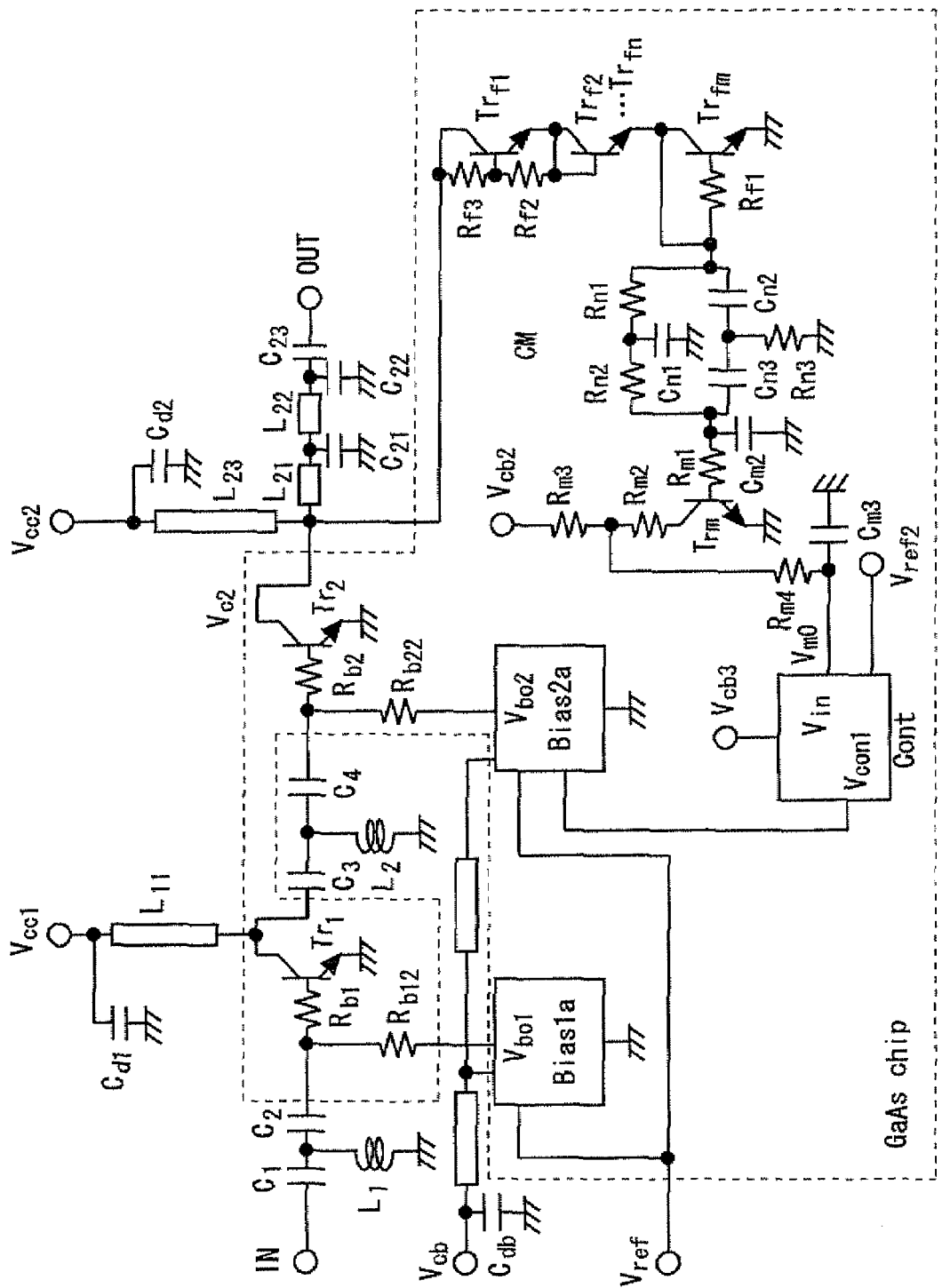
FIG. 4 is a circuit diagram showing a power amplifier according to a second embodiment of the present invention.

FIG. 4 is a circuit diagram showing a power amplifier according to a second embodiment of the present invention. The second embodiment differs from the first embodiment in that the current mirror circuit CM has a twin-T circuit (notch filter) for removal of high-frequency components in place of the RF blocking inductor Lm1. The twin-T circuit can be formed only of resistors Rn1 to Rn3 and capacitors Cn1 to Cn3. The chip component Lm1 can be omitted if the center frequency of the twin-T circuit is set in the operating frequency region. As a result, the arrangement for removing high-frequency components can be realized only by slightly increasing the GaAs chip area, thus enabling the power amplifier to be reduced in size. Also, the same advantages as those of the first embodiment can be obtained.

Third Embodiment

Figure 5:
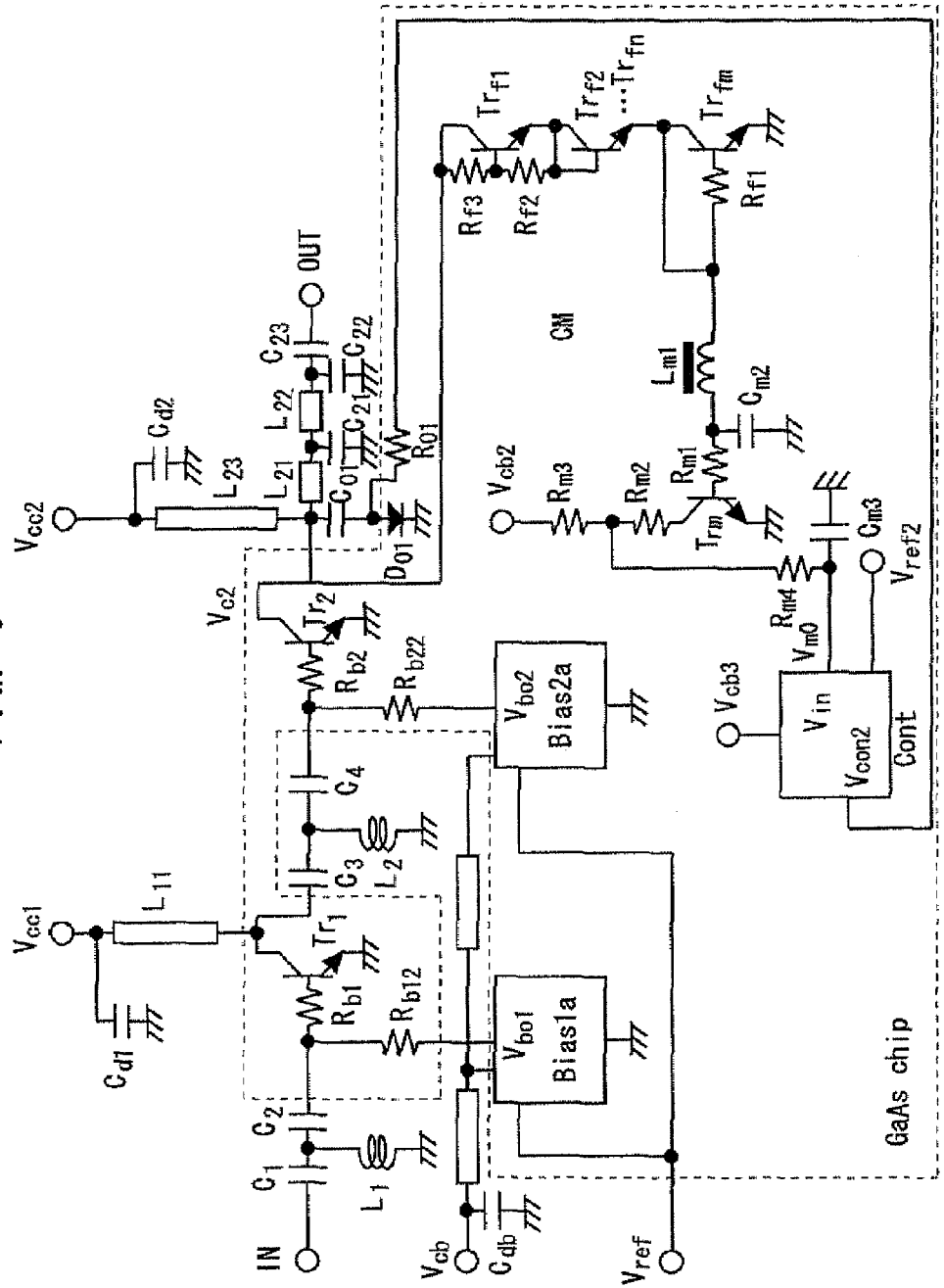
FIG. 5 is a circuit diagram showing a power amplifier according to a third embodiment of the present invention.

FIG. 5 is a circuit diagram showing a power amplifier according to a third embodiment of the present invention. This power amplifier has a capacitor $C_{01}$ a diode $D_{01}$ and a resistor $R_{01}$ in addition to the components of the power amplifier according to the first embodiment.

When the collector voltage Vc2 of Tr2 exceeds the threshold voltage of the current mirror circuit CM with an internal Vbe multiplier set in advance, a current flows through Trfm and a current also flows through Trm, as in the first embodiment. The monitored voltage Vmo is thereby reduced relative to the reference voltage Vref2, and Vcon2 changes from low to high. A current is thereby caused to flow through the diode $D_{01}$ to change the diode from the off state to the on state, so that the power amplifier is changed from a gentle load curve state $C_C$ to a steep load curve state $C_A$. That is, when the peak Vc2 becomes higher than the voltage set in advance, the control circuit cont raises the Tr2 load curve. Thus, the same effect of limiting a degradation in the distortion characteristic as that in the first embodiment is achieved.

Figure 15:
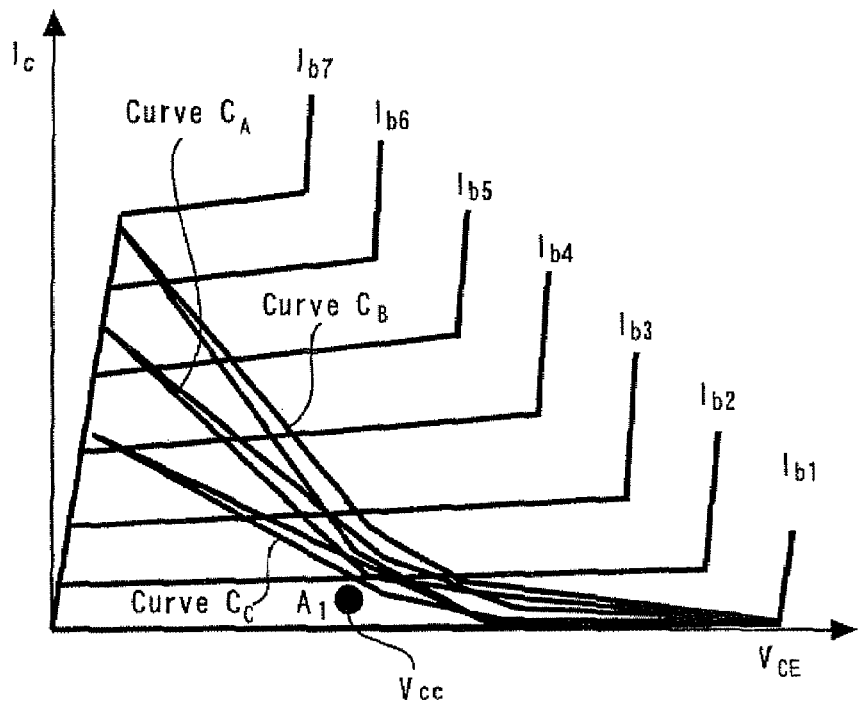
FIG. 15 is a diagram showing load curves of a conventional power amplifier with respect to variation in load.
Figure 16:
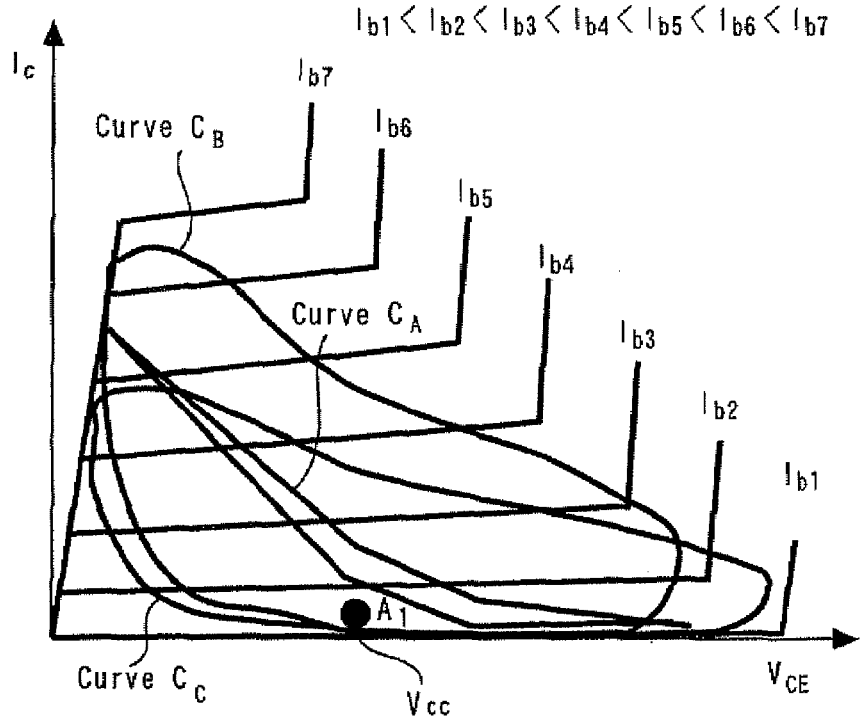
FIG. 16 is a diagram showing load curves of a conventional power amplifier with respect to variation in load.

However, a degradation in the distortion characteristic is due to a non-optimum load curve gradient such as shown in FIG. 15. In many cases, therefore, load curve control such as that in the third embodiment is more effective than bias current control such as that in the first and second embodiments.

Fourth Embodiment

Figure 6:
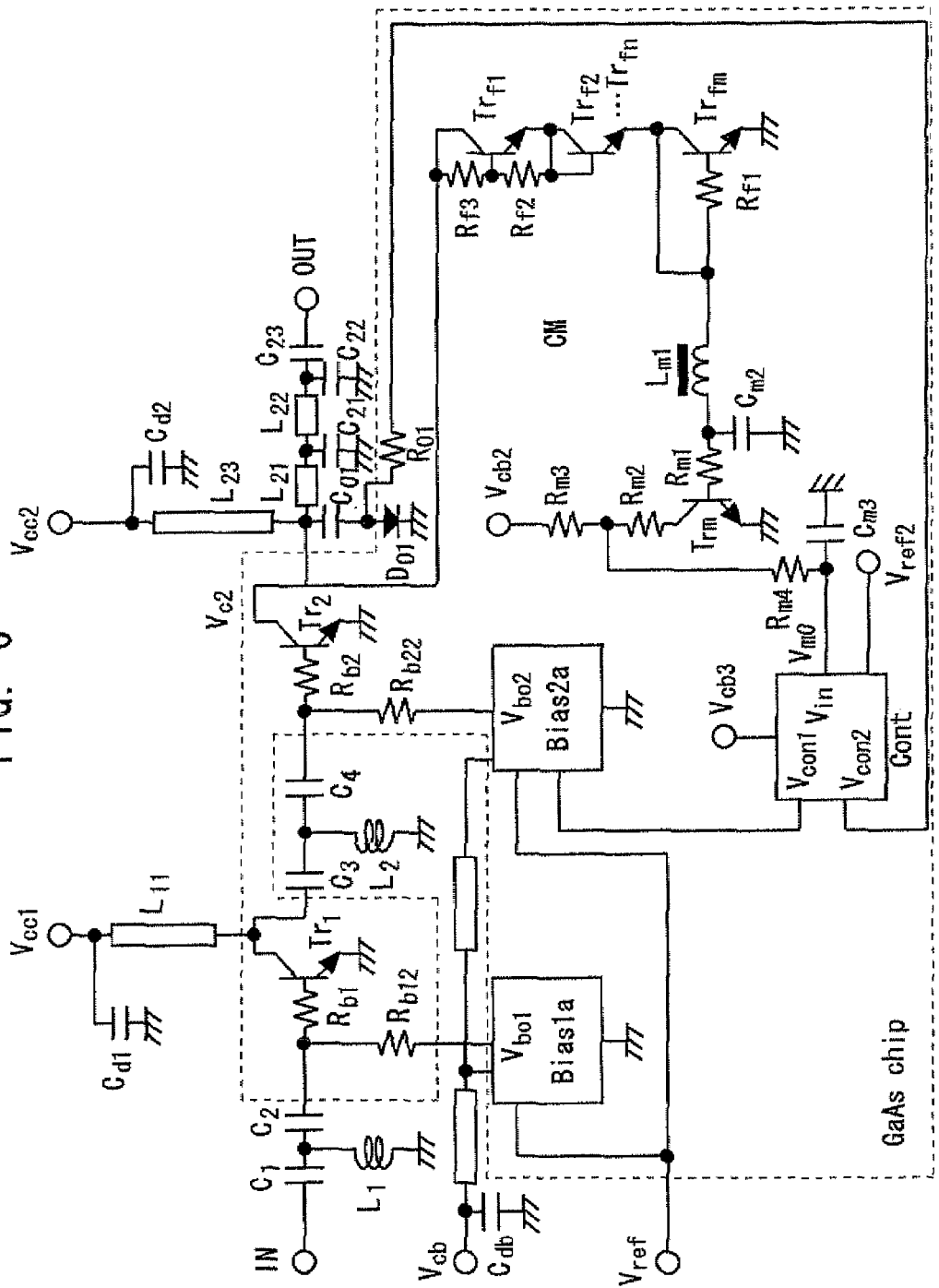
FIG. 6 is a circuit diagram showing a power amplifier according to a fourth embodiment of the present invention.

FIG. 6 is a circuit diagram showing a power amplifier according to a fourth embodiment of the present invention. In this power amplifier, detection of peak Vc2 of the final-stage Tr2 and control of the bias current in Tr2 are performed, as are those in the first embodiment. Also, control of the load curve is performed, as is that in the first embodiment. The same advantages as those of the first and third embodiments can be obtained in this way.

Fifth Embodiment

Figure 7:
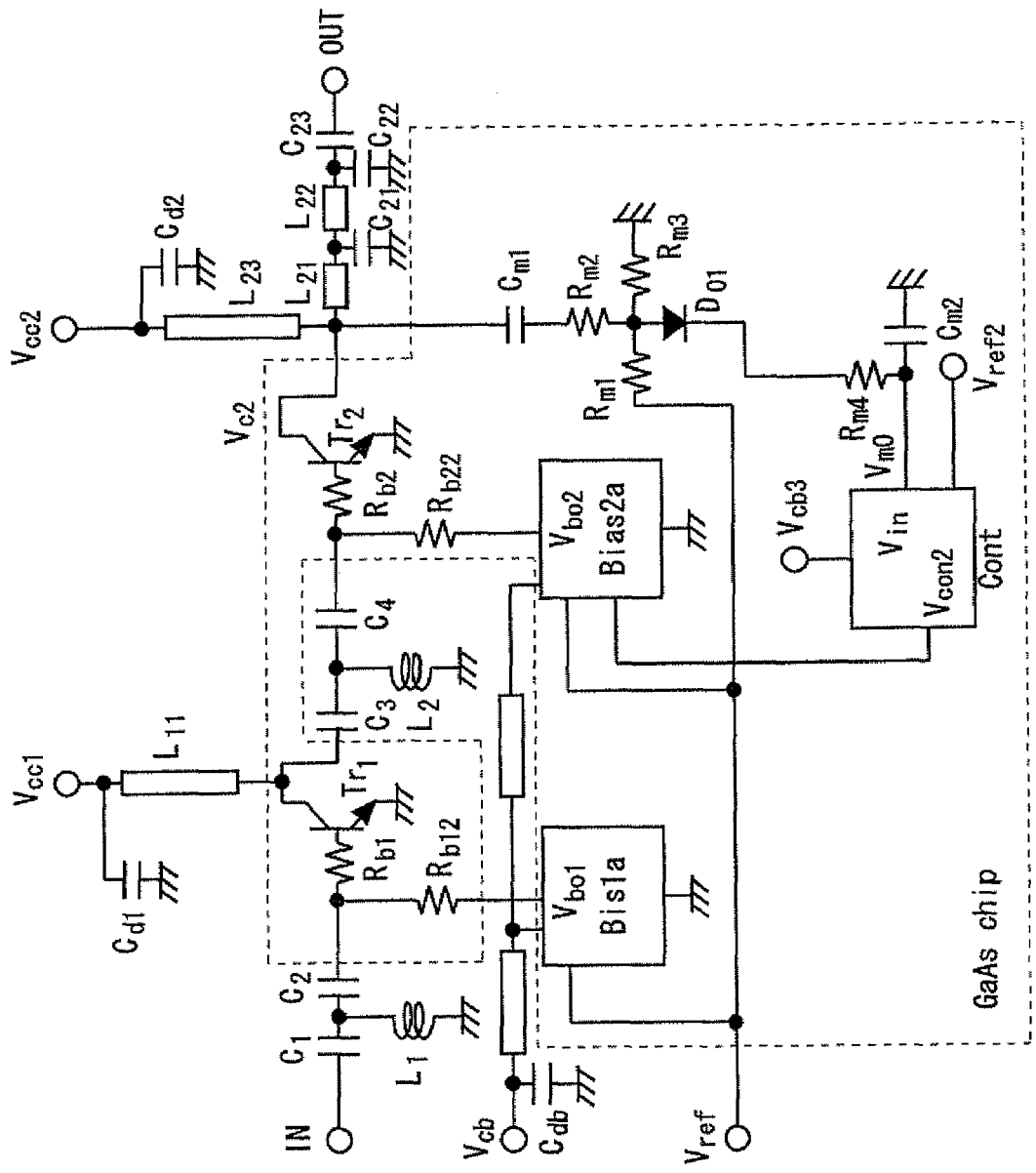
FIG. 7 is a circuit diagram showing a power amplifier according to a fifth embodiment of the present invention.

FIG. 7 is a circuit diagram showing a power amplifier according to a fifth embodiment of the present invention. This power amplifier uses a diode detection circuit in place of the current mirror circuit CM with a Vbe multiplier in the first embodiment. The diode detection circuit has capacitors Cm1 and Cm2, resistors Rm1 to Rm4 and a diode $D_{01}$. The diode detection circuit has a slightly reduced peak Vc2 detection accuracy in comparison with the current mirror circuit CM, but has the advantage of being simply configured.

The operation of the above-described power amplifier will be described. A low bias current is supplied from the terminal Vref to $D_{01}$ through Rm1, and a peak Vd of Tr2 is detected through Cm1 and smoothed into a DC voltage Vm0. A suitable resistor dividing value of Rm2 and Rm3 is set to ensure that when a certain peak Vc2 value is exceeded, Vm0 exceeds the reference voltage Vref2 and the output voltage Vcon2 is changed from high to low. As a result, the bias current is increased to improve the distortion characteristic with respect to variation in load.

Sixth Embodiment

Figure 10:
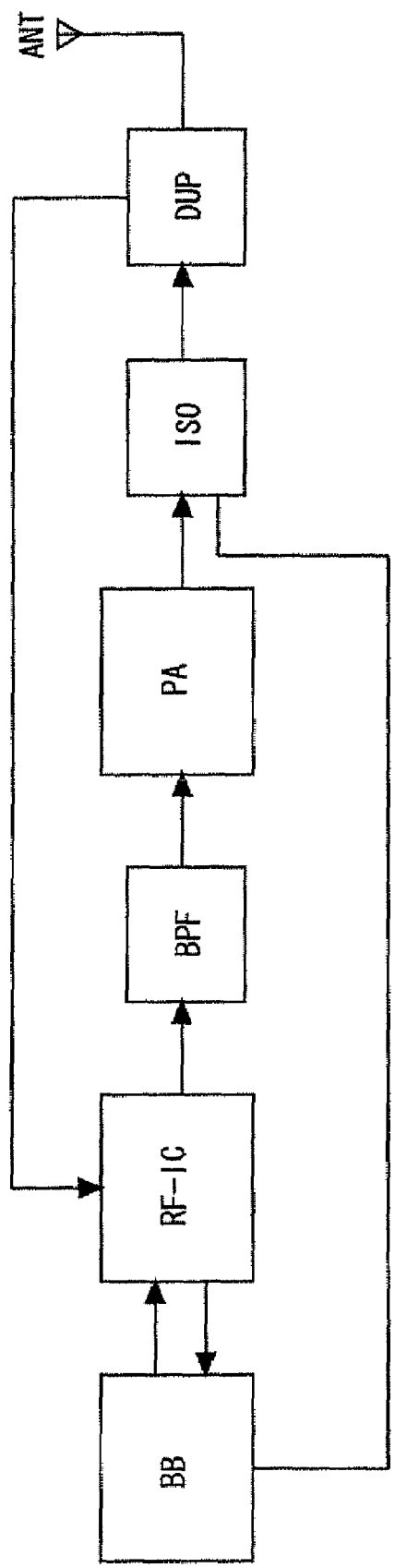
FIG. 10 is a block diagram showing a wireless communication device for a portable telephone for use in a CDMA system.

In a power amplifier according a sixth embodiment of the present invention, the monitored voltage Vmo in the power amplifier according to the first to fifth embodiments is fed back to the baseband LSI shown in FIG. 10, and the power supplied from the RF-IC and input to the power amplifier is reduced when the AD-converted level of the output from the baseband LSI becomes equal to or higher than a certain set value. That is, when the peak value from the current mirror circuit CM becomes higher than the voltage set in advance, the control circuit controls the baseband signal processing section to reduce the power of the signal input form the RF circuit to the power amplifier.

Not only an increase in the bias current in the power amplifier itself but also a reduction in input power is caused. In this way, the distortion characteristic can be improved in comparison with the first to fifth embodiment, although the output power level is reduced.

Seventh Embodiment

Figure 8:
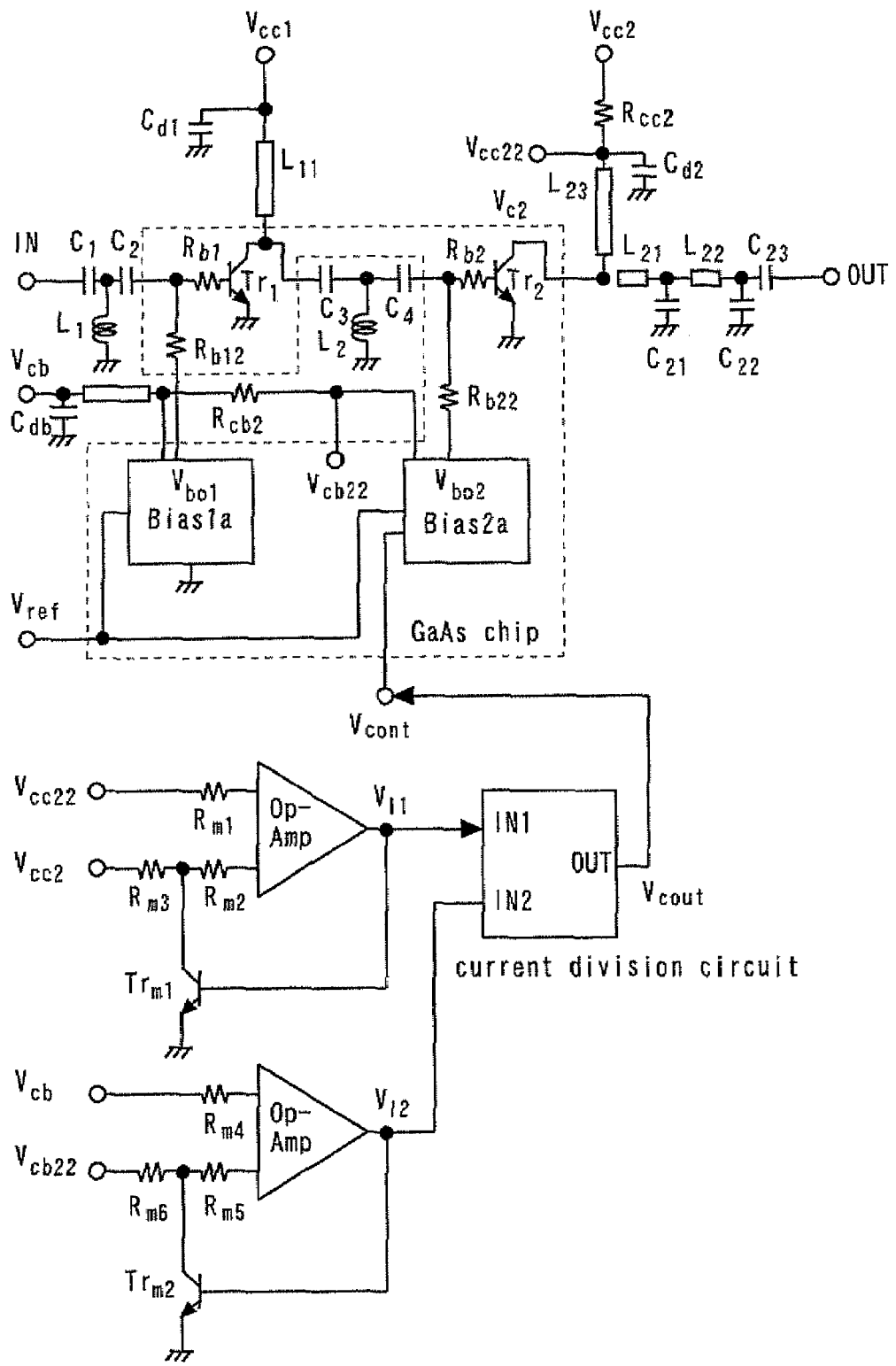
FIG. 8 is a circuit diagram showing a power amplifier according to a seventh embodiment of the present invention.

FIG. 8 is a circuit diagram showing a power amplifier according to a seventh embodiment of the present invention. This power amplifier has, in addition to the components of the conventional power amplifier shown in FIG. 11, monitor terminals Vcb22 and Vcc22, voltage sensing resistors Rcc2 and Rcb2 for converting Ic2 and Icb2 into voltages, resistors Rm1 to Rm6, transistors Tm1 and Trm2, which are HBTs, an operational amplifier Op-Amp and a current division circuit. In this circuit, the operating current Ic2 of Tr2 and the bias current Icb2 of the bias circuit Bias2a are monitored; a DC output voltage Vcout is output according to the value of Ic2/Icb2; and the bias current is increased when the value of Ic2/Icb2 becomes equal to or lower than a value set in advance, thus improving the distortion characteristic with respect to variation in load.

Figure 9:
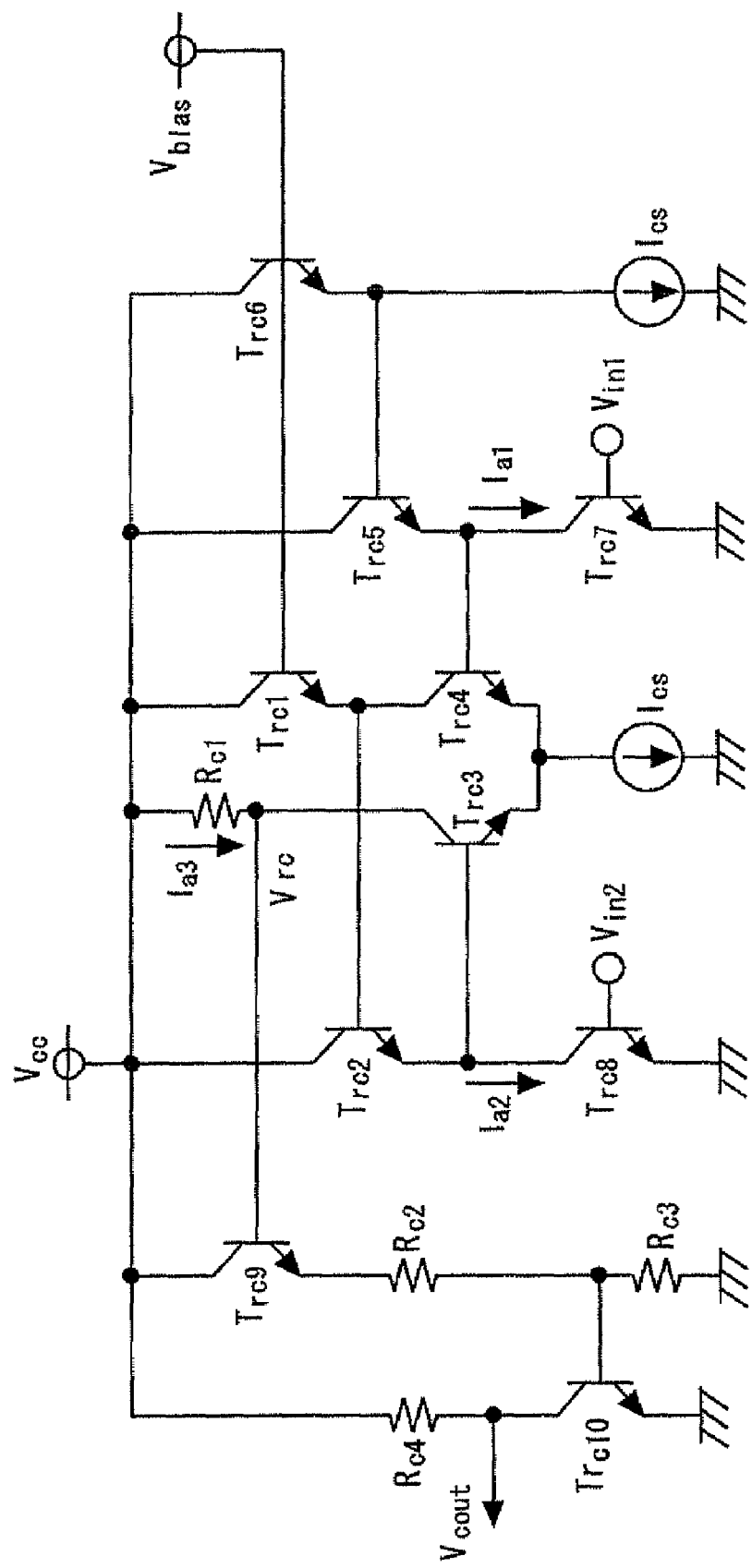
FIG. 9 is a circuit diagram showing the current division circuit.

FIG. 9 is a circuit diagram showing the current division circuit. The current division circuit has transistors Trc1 to Trc10, which are HBTs, a constant current source Ics, resistors Rc1 to Rc4, a power supply voltage Vcc, a bias voltage Vbias, input terminals Vin1 and Vin2, and an output terminal Vcout. Ia1, Ia2 and Ia3 denote collector currents respectively flowing through Trc7, Trc8 and Trc3.

The operation of the above-described power amplifier will be described. The Op-Amp controls the base voltage of Trm1 so that a voltage drop Rcc2·Ic2 due to Ic2 is equal to the product of Rm3 and the current flowing through Rm3. The same control is also performed with respect to Icb2.

Figure 14:
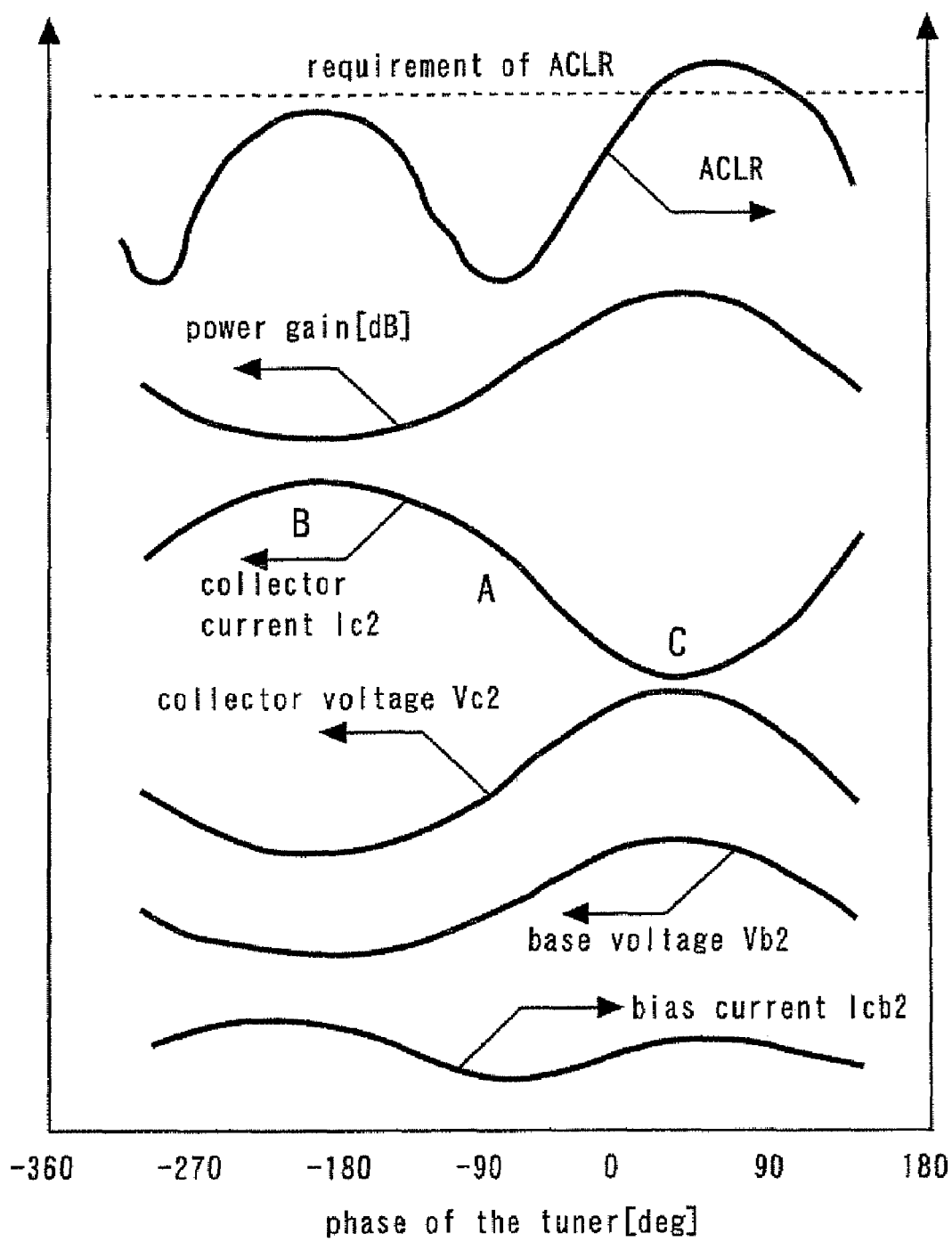
FIG. 14 is a diagram showing characteristics of a conventional power amplifier with respect to variation in load.

Voltages Vi1 and Vi2 are applied to Vin1 and Vin2 of the current division circuit. Currents Ia1 and Ia2 flowing through Trc7 and Trc8 are proportional to Ic2 and Icb2 detected by the Op-Amp. Collector current Ia3 through Tr3 as a result of this voltage application is Ia2/Ia1 and an output voltage obtained by voltage conversion by the resistor Ro is output from Vcout. If Rcc2, Rcb2, Rm3, Rm6 and Rc1 to Rc4 are set to suitable values, Ic2/Icb2 decreases largely when the load is changed, that is, when the point C in FIG. 14 is reached. At this time, Ia3=Ia2/Ia1 also decreases largely. The collector voltage Vrc of Trc3 then becomes higher and the base voltage of Trc10 also rises. When Trc10 is turned on, the output voltage Vcout changes from high to low to increase the bias current. That is, the current division circuit computes Ic2/Icb2, and increases the bias current by controlling Bias2a when the value of Ic2/Icb2 becomes lower than the value set in advance. The distortion characteristic can be improved in this way.

Portions of this circuit including the current monitor and the division circuit can be made only as a Si-based circuit. However, Ic2/Icb2 having a strong correlation with a change in load as shown in FIG. 17 can be monitored, detection of a degradation in the distortion characteristic due to a change in load can be performed with improved reliability in comparison with detection by monitoring a peak Vc2 in the first to sixth embodiments. Thus, the distortion characteristic of the output from the power amplifier with respect to variation in load can be improved, as in the first to fifth embodiments.

Eighth Embodiment

A power amplifier according to an eighth embodiment detects Ic2/Icb2, as does that in Embodiment 7. Also, the power amplifier according to the eighth embodiment performs load curve control, as does that in the third embodiment. That is, the current division circuit computes Ic2/Icb2 and raises the Tr2 load curve when the value of Ic2/Icb2 becomes lower than the value set in advance. In this case, Vcout is taken out not from the collector of Trc10 but from the base voltage of Trc10, and Vcout is changed from low to high when the value of Ic2/Icb2 becomes lower. In this way, the same advantage that of the seventh embodiment can be obtained.

Ninth Embodiment

A power amplifier according to a ninth embodiment performs detection of Ic2/Icb2 and bias current control, as does that in Embodiment 7. Also, the power amplifier according to the ninth embodiment performs load curve control, as does that in the eighth embodiment. In this way, the same advantage that of the seventh and eighth embodiments can be obtained.

Tenth Embodiment

In a power amplifier according to a tenth embodiment of the present invention, the monitored voltage Vmo in the power amplifier according to the seventh to ninth embodiments is fed back to the baseband LSI shown in FIG. 10, and the power supplied from the RF-IC and input to the power amplifier is reduced when the AD-converted level of the output from the baseband LSI becomes equal to or higher than a certain set value. That is, the current division circuit computes the quotient of the operating current of the power amplifying transistor and the bias current and reduces the power of the signal input from the RF circuit to the power amplifier by controlling the baseband signal processing section when the value of the quotient becomes smaller than the value set in advance.

Not only an increase in the bias current in the power amplifier itself but also a reduction in input power is caused. In this way, the distortion characteristic can be improved in comparison with the seventh to ninth embodiment, although the output power level is reduced.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-264168, filed on Sep. 12, 2005 including specification, claims, drawings and summary, on which the Convention priority of the present application is based, are incorporated herein by reference in its entirety.

What is claimed is:

1. A power amplifier comprising:
a power amplifying transistor;
a bias circuit which supplies a bias current to the base of the power amplifying transistor;
a current mirror circuit which detects a peak value of the collector voltage of the power amplifying transistor; and
a control circuit which, when the peak value of the collector voltage becomes higher than a voltage set in advance, controls the bias circuit to increase the bias current.

2. A power amplifier comprising:
a power amplifying transistor;
a bias circuit which supplies a bias current to the base of the power amplifying transistor;
a current mirror circuit which detects a peak value of the collector voltage of the power amplifying transistor; and
a control circuit which raises a load curve of the power amplifying transistor when the peak value of the collector voltage becomes higher than a voltage set in advance.

3. The power amplifier according to claim 1, wherein the current mirror circuit has a choke inductor for removing high-frequency components.

4. The power amplifier according to claim 2, wherein the current mirror circuit has a choke inductor for removing high-frequency components.

5. The power amplifier according to claim 1, wherein the current mirror circuit has a notch filter for removing high-frequency components.

6. The power amplifier according to claim 2, wherein the current mirror circuit has a notch filter for removing high-frequency components.

7. A wireless communication device comprising:
an antenna terminal for performing transmission and reception of signals;
a baseband signal processing section which demodulates and decodes a received signal, and which encodes and modulates a signal to be transmitted;
an RF circuit which converts a signal output from the baseband signal processing section into a signal of a predetermined frequency; and
a power amplifier which amplifies a signal output from the RF circuit, the power amplifier having:
a power amplifying transistor;
a bias circuit which supplies a bias current to the base of the power amplifying transistor;
a current mirror circuit which detects a peak value of the collector voltage of the power amplifying transistor; and
a control circuit which, when the peak value from the current mirror circuit becomes higher than a voltage set in advance, controls the baseband signal processing section to reduce the power of the signal input from the RF circuit to the power amplifier.

* * * * *